United States Patent
Noro

(10) Patent No.: US 6,885,532 B2
(45) Date of Patent: Apr. 26, 2005

(54) CURRENT DETECTION AND OVERCURRENT PROTECTION FOR TRANSISTORS IN PULSE-WIDTH MODULATION AMPLIFIER

(75) Inventor: Masao Noro, Hamamatsu (JP)

(73) Assignee: Yamaha Corporation, Hamamatsu (JP)

(*) Notice: Subject to any disclaimer, the term of this patent is extended or adjusted under 35 U.S.C. 154(b) by 118 days.

(21) Appl. No.: 10/216,350

(22) Filed: Aug. 9, 2002

(65) Prior Publication Data

US 2003/0030956 A1 Feb. 13, 2003

(30) Foreign Application Priority Data

Aug. 13, 2001 (JP) .................................... P2001-245182

(51) Int. Cl.[7] .............................................. H02H 3/08
(52) U.S. Cl. ............................................... 361/93.1
(58) Field of Search ........................... 361/93.1, 78, 87

(56) References Cited

U.S. PATENT DOCUMENTS

| | | | | |
|---|---|---|---|---|
| 4,415,863 A | * | 11/1983 | Tokumo | 330/10 |
| 5,719,519 A | * | 2/1998 | Berringer | 327/423 |
| 6,246,220 B1 | * | 6/2001 | Isham et al. | 323/224 |

FOREIGN PATENT DOCUMENTS

| | | |
|---|---|---|
| JP | 57-131125 | 8/1982 |
| JP | 61-102816 | 5/1986 |
| JP | 62-065517 | 3/1987 |
| JP | 03-112319 | 5/1991 |
| JP | 11-239029 | 8/1999 |
| KR | 0164408 | 2/1999 |

OTHER PUBLICATIONS

Korean Patent Office Office Action Dated Jun. 2, 2004.

* cited by examiner

Primary Examiner—Michael Sherry
Assistant Examiner—James Demakis
(74) Attorney, Agent, or Firm—Pillsbury Winthrop LLP

(57) ABSTRACT

A current detection circuit applicable to a switching circuit using switching transistors to supply a prescribed load current to a load, comprises a sample-hold capacitor for temporarily holding a terminal voltage of the switching transistor that is turned on, and a switch that is inserted between the switching transistor and sample-hold capacitor and is controlled to be turned on in synchronization with the ON-timing of the switching transistor, wherein charged voltage of the sample-hold capacitor is detected as a detection voltage. An overcurrent detection circuit is constituted in such a way that the switching transistor is compulsorily turned off when the detection voltage exceeds reference voltage. The switching circuit may correspond to a pulse-width modulation (PWM) amplifier using a pair of a PMOS transistor and an NMOS transistor that are alternately turned on or off.

7 Claims, 7 Drawing Sheets

US 6,885,532 B2

CURRENT DETECTION AND OVERCURRENT PROTECTION FOR TRANSISTORS IN PULSE-WIDTH MODULATION AMPLIFIER

BACKGROUND OF THE INVENTION

1. Field of the Invention

This invention relates to current detection methods and circuits for detecting currents flowing through switching transistors arranged in outputs of pulse-width modulation (PWM) amplifiers, which are provided for LSI chips and ICs. In addition, this invention also relates to overcurrent protection against abnormally high currents flowing through switching transistors of PWM amplifiers.

2. Description of the Related Art

It is necessary to detect currents flowing through switching transistors arranged at outputs of switching circuits such as PWM amplifiers, which are provided for LSI chips and ICs. The current detection is realized by inserting resistors in series to switching transistors. Alternatively, the current detection is realized by using wiring resistances of ICs.

However, the current detection must conventionally cause power loss because of the use of the 'current detecting' resistors. Even though the current detection is realized using wiring resistances of ICs, it is very difficult to accurately perform current detection because wiring resistances cannot be always defined with a good accuracy because of dispersions of dimensions of wires.

SUMMARY OF THE INVENTION

It is an object of the invention to provide a current detection method and circuit that can actually perform current detection without causing power loss.

It is another object of the invention to provide overcurrent protection against abnormally high currents flowing through switching transistors arranged at outputs of PWM amplifiers for use in LSI chips and ICs.

A current detection circuit of this invention is applicable to a switching circuit using switching transistors to supply a prescribed load current to a load (e.g., speaker) via a low-pass filter. The current detection circuit comprises a sample-hold capacitor for temporarily holding the terminal voltage of the switching transistor that is turned on, and an analog switch that is inserted between the switching transistor and sample-hold capacitor and is controlled to be turned on in synchronization with the ON-timing of the switching transistor, wherein charged voltage of the sample-hold capacitor is detected as detection voltage ($V_{S1}$, $V_{S2}$). Because the current detection circuit does not require a specific resistor and the like causing unwanted power loss, it is capable of detecting currents with a high accuracy.

An overcurrent protection circuit can be constituted in such a way that the switching transistor is compulsorily turned off when the detection voltage exceeds the reference voltage, which is set in advance.

In the above, the switching circuit may correspond to a pulse-width modulation (PWM) amplifier using a pair of a PMOS transistor and an NMOS transistor that are alternately turned on or off, so that the load current is extracted from a connection point between the drains of these transistors.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENTS

This invention will be described in further detail by way of examples with reference to the accompanying drawings.

Figure 1:
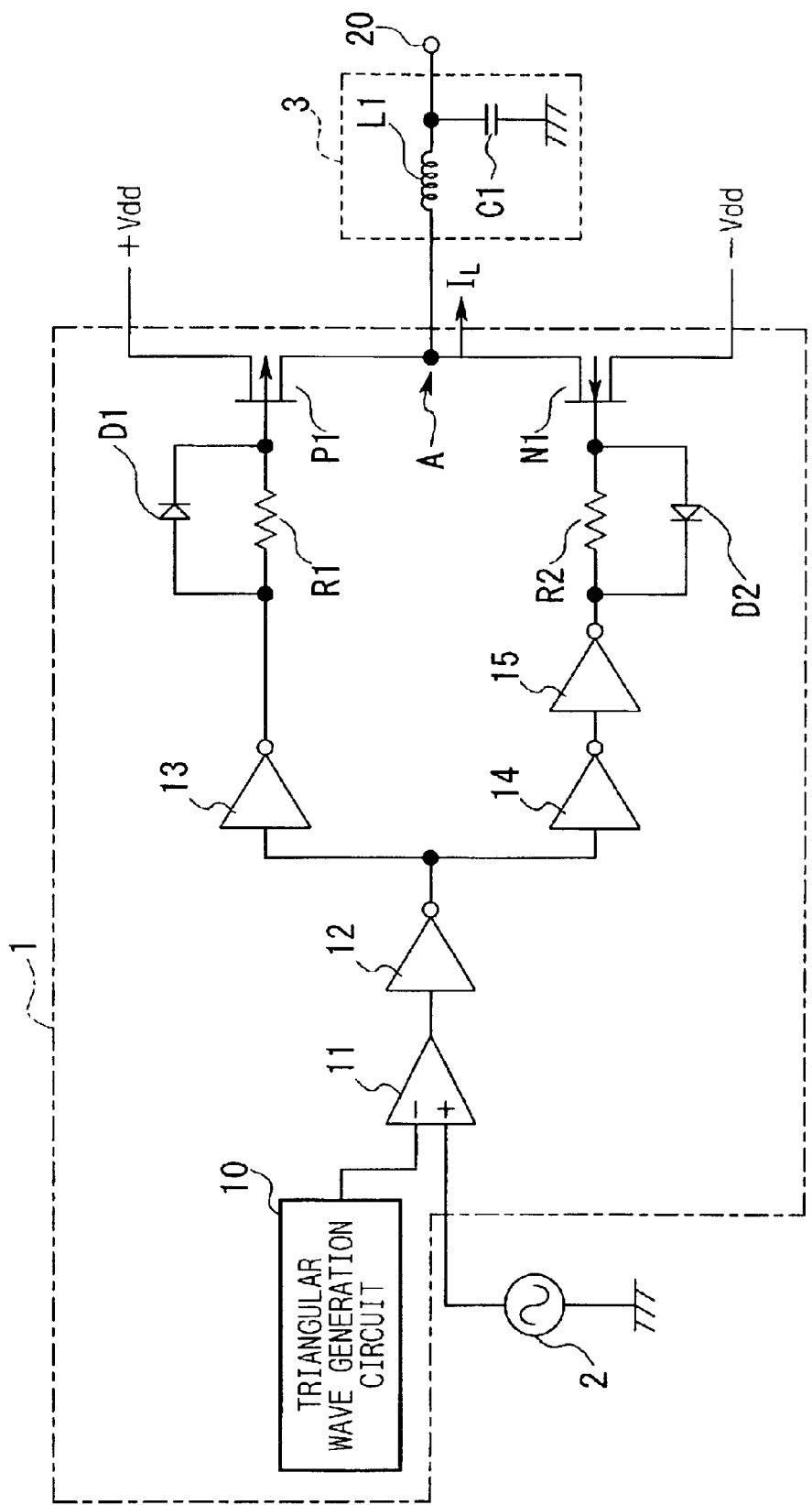
FIG. 1 is a circuit diagram showing the configuration of a pulse-width modulation (PWM) amplifier in accordance with a preferred embodiment of the invention.

FIG. 1 shows the overall configuration of a pulse-width modulation (PWM) amplifier, which is an example of a switching circuit, in accordance with the preferred embodiment of the invention. In the PWM amplifier 1 shown in FIG. 1, a triangular wave generation circuit 10 generates a triangular wave signal as the reference signal for the PWM amplifier 1, which is compared with an input signal such as an audio signal output from a signal source 2 in a comparator 11. The output of the comparator 11 is subjected to waveform shaping in an inverter 12, the output of which is delivered to an inverter 13 and 'series' inverters 14 and 15, which are followed by switching transistors P1 and N1. That is, the inverter 13 provides a positive-phase signal of the comparator 11 towards the PMOS transistor P1 (where 'PMOS' stands for 'P-channel Metal-Oxide Semiconductor'), while the series inverters 14 and 15 provide a negative-phase signal of the comparator 11 towards the NMOS transistor N1 (where 'NMOS' stands for 'N-channel Metal-Oxide Semiconductor'). A parallel circuit consisting of a diode DI and a resistor RI acts as a delay circuit for delaying the ON-timing of the PMOS transistor P1. Similarly, a parallel circuit consisting of a diode D2 and a resistor R2 acts as a delay circuit for delaying the ON-timing of the NMOS transistor N1. The PMOS transistor P1 and the NMOS transistor N1 act as the switching transistors for providing different types of outputs in the PWM amplifier 1.

Specifically, the source of the PMOS transistor P1 is connected with positive source voltage+Vdd, while the source of the NMOS transistor N1 is connected with negative source voltage−Vdd. In addition, the drain of the PMOS transistor P1 and the drain of the NMOS transistor N1 are connected together at a point 'A', which is connected to an output terminal 20 via a low-pass filter 3 consisting of an inductor (or inductance) L1 and a capacitor (or capacitance) C1. Actually, a speaker (not shown) is connected to the output point 20 as the load.

In the PWM amplifier 1, the comparator 11 compared a triangular wave signal of the triangular wave generation circuit 10 with an input signal of the signal source 2, thus producing a pulse-width modulation (PWM) signal consisting of pulses whose pulse widths vary in response to the level of the input signal. The PWM signal output from the comparator 11 is inverted and is subjected to waveform shaping by the inverter 12. The inverted output of the inverter 12 is provided for the gate of the PMOS transistor PI via the inverter 13, diode D1, and resistor R1. In addition, the inverted output of the inverter 12 is also provided for the gate of the NMOS transistor N1 via the inverters 14 and 15, diode D2, and resistor R2.

In the PWM amplifier 1 that produces the aforementioned PWM signal through the comparison between the triangular wave signal and the input signal, the PMOS transistor P1 and the NMOS transistor N1 are alternately turned on or off in synchronization with each other. That is, the NMOS transistor N1 is automatically turned off substantially at the ON-timing of the PMOS transistor P1 that is turned on in response to the PWM signal. In addition, the NMOS transistor N1 is automatically turned on substantially at the OFF-timing of the PMOS transistor P1 that is turned off in response to the PWM signal. In short, the PMOS transistor P1 and the NMOS transistor N1 are alternately turned on or off in response to the PWM signal. Such alternately switching between the transistors P1 and N1 is repeated as long as the comparator 11 produces and outputs the PWM signal based on the triangular wave signal and input signal.

Figure 2:
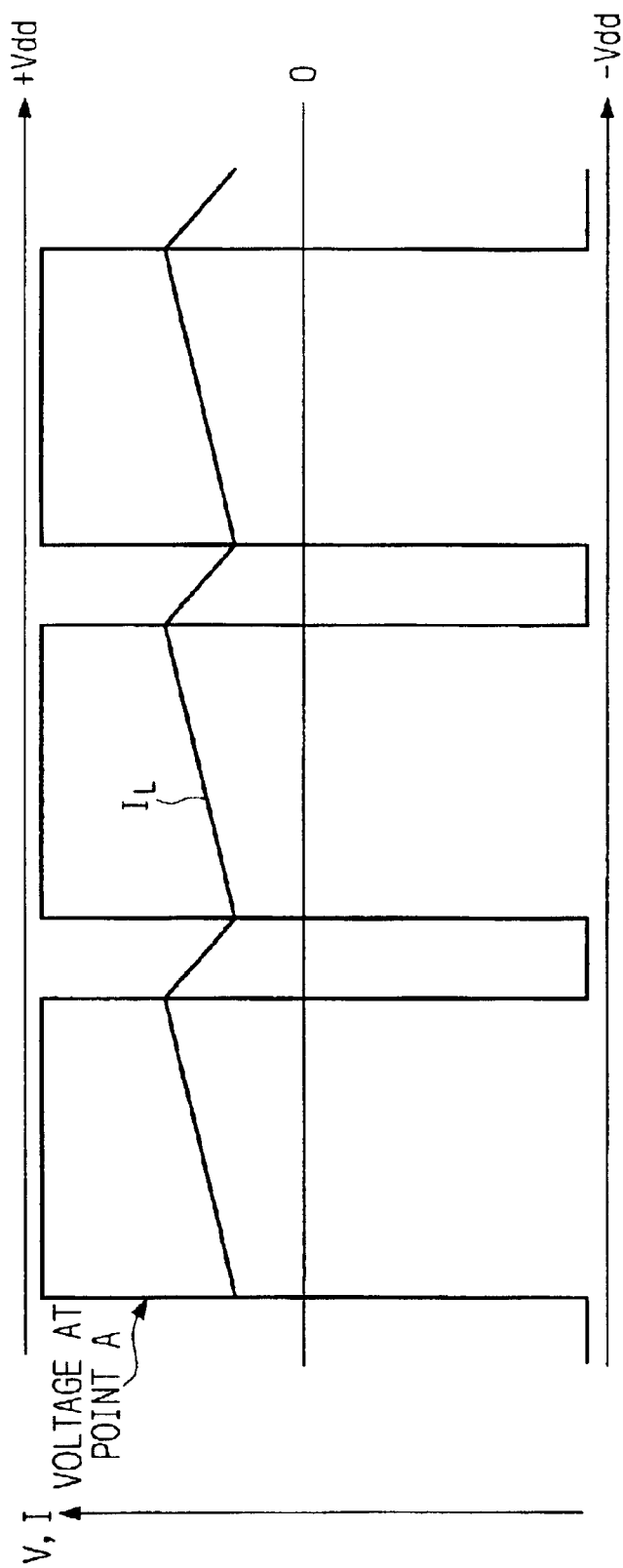
FIG. 2 shows a waveform representing variations of voltage at a connection point between switching transistors in the PWM amplifier, and a waveform representing a load current $I_L$ output from the PWM amplifier via a low-pass filter.

FIG. 2 shows variations of the potential measured at the connection point A between the drain of the PMOS transistor P1 and the drain of the NMOS transistor N1. That is the potential of the connection point A periodically varies in the range between the positive source voltage+Vdd and the negative source voltage−Vdd. In response to variations of the potential of the connection point A, a load current $I_L$, which is output to the output terminal 20 via the low-pass filter 3, correspondingly varies due to charging and discharging operations of the capacitor C1 of the low-pass filter 3.

Figure 3:
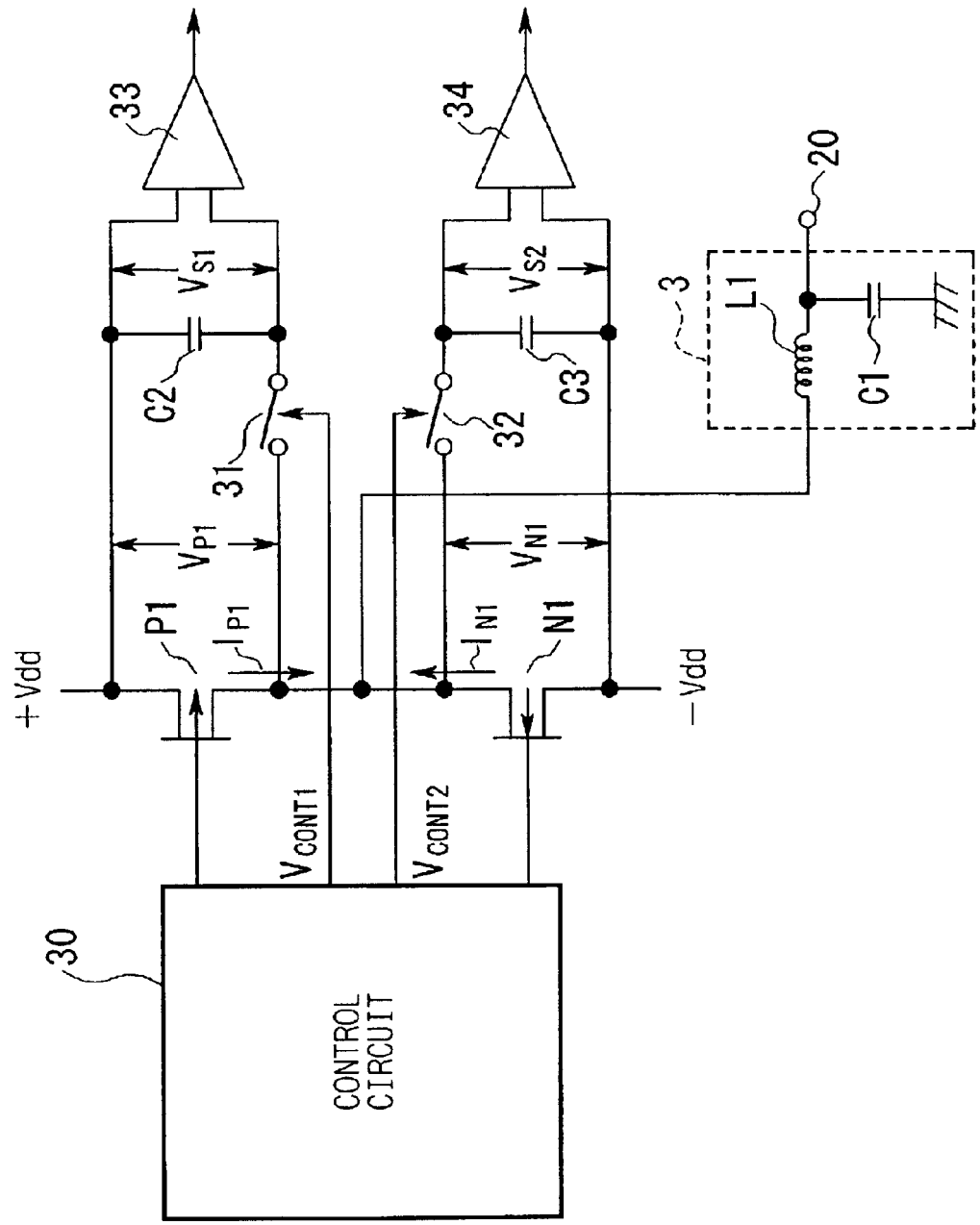
FIG. 3 is a circuit diagram showing current detection circuits that are arranged in connection with switching transistors in the PWM amplifier.

FIG. 3 diagrammatically shows configurations of current detection circuits applied to the PWM amplifier shown in FIG. 1, wherein parts identical to those shown in FIG. 1 are designated by the same reference numerals and symbols. Specifically, a first current detection circuit is arranged to detect the current flowing through the PMOS transistor P1, and a second current detection circuit is arranged to detect the current flowing through the NMOS transistor N1 when the PWM amplifier 1 provides the load with the load current via these transistors.

Both the current detection circuits are controlled by a single control circuit 30. Specifically, the first current detection circuit comprises a sample-hold capacitor C2, an analog switch 31, and a buffer amplifier 33, all of which are connected together in connection with the PMOS transistor Pl. Herein, the control circuit 30 controls the analog switch 31 to be turned on in synchronization with the ON-timing of the PMOS transistor P1, so that the sample-hold capacitor C2 temporarily holds the voltage between the terminals (i.e., source and drain) of the PMOS transistor P1 which is turned on. Thus, the buffer amplifier 33 detects the voltage held by the sample-hold capacitor C2 at the ON-timing of the PMOS transistor P1. Similarly, the second current detection circuit comprises a sample-hold capacitor C3, an analog switch 32, and a buffer amplifier 34, all of which are connected together in connection with the NMOS transistor N1. The control circuit 30 controls the analog switch 32 in synchronization with the ON-timing of the NMOS transistor N1, so that the sample-hold capacitor C3 temporarily holds the voltage between the terminals (i.e., source and drain) of the NMOS transistor N1 which is turned on. Thus, the buffer amplifier 34 detects the voltage held by the sample-hold capacitor C3 at the ON-timing of the NMOS transistor N1.

The control circuit 30 provides control signals $V_{CONT1}$ and $V_{CONT2}$ to turn on the analog switches 31 and 32 alternately. That is, the analog switch 31 is turned on in synchronization with the ON-timing of the PMOS transistor P1, while the analog switch 32 is turned on in synchronization with the ON-timing of the NMOS transistor N1.

In the above, the control circuit 30 provides the PWM signal to the PMOS transistor P1 and the NMOS transistor N1 respectively. In addition, the control circuit 30 may use a partial signal derived from the PWM signal for the control signals $V_{CONT1}$ and $V_{CONT2}$ respectively.

As described above, the control circuit 30 outputs the control signal $V_{CONT1}$ to the analog switch 31 in synchronization with the ON-timing of the PMOS transistor P1. In addition, the control circuit 30 alternately outputs the control signal $V_{CONT2}$ to the analog switch 32 in synchronization with the ON-timing of the NMOS transistor N1. As a result, the analog switches 31 and 32 are alternately turned on in synchronization with the ON-timing of the PMOS transistor P1 and the ON-timing of the NMOS transistor N1 respectively. That is, the sample-hold capacitor C2 holds voltage $V_{S1}$ corresponding to terminal voltage $V_{P1}$, which occurs in response to current $I_{P1}$ flowing through the PMOS transistor P1 which is turned on. In addition, the sample-hold capacitor C3 holds voltage $V_{S2}$ corresponding to terminal voltage $V_{N1}$, which occurs in response to current $I_{N1}$ flowing through the NMOS transistor N1 which is turned on.

Figure 4A:
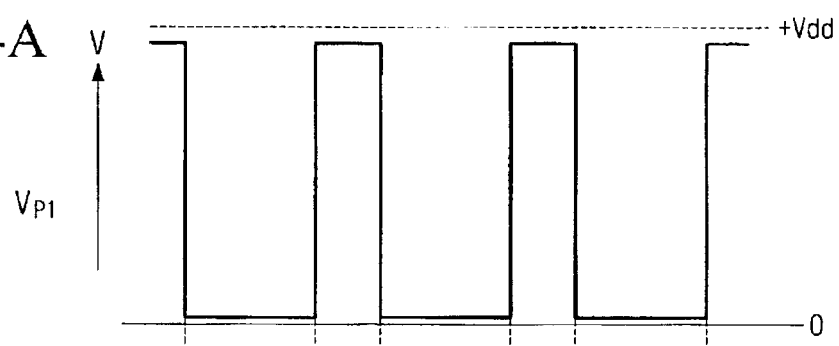
FIG. 4A shows a waveform representing variations of terminal voltage of a PMOS transistor.
Figure 4B:
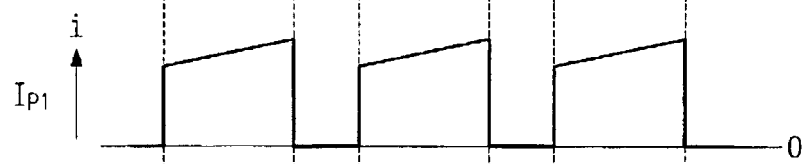
FIG. 4B shows a waveform representing variations of a current flowing through the PMOS transistor.
Figure 4C:
FIG. 4C shows a waveform representing variations of a first control signal $V_{CONT1}$ for controlling an analog switch arranged in connection with the PMOS transistor.
Figure 4D:
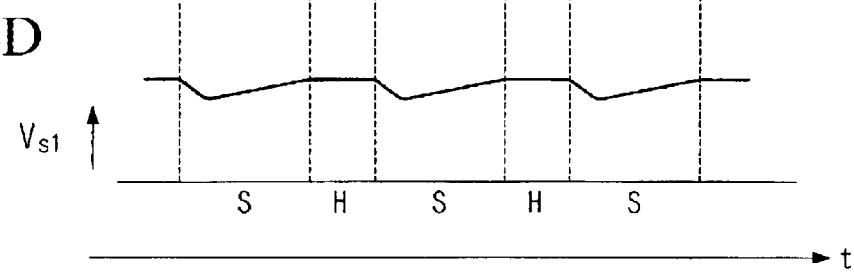
FIG. 4D shows a waveform representing variations of detection voltage $V_{S1}$ caused by periodical charging and discharging operations of a capacitor arranged in connection with the PMOS transistor.

Next, the overall operation of the first current detection circuit arranged in connection with the PMOS transistor P1 will be described with reference to FIGS. 4A to 4D. Herein, FIG. 4A shows variations of terminal voltage $V_{P1}$ measured between terminals of the PMOS transistor P1; FIG. 4B shows variations of current $I_{P1}$ flowing through the PMOS transistor P1; FIG. 4C shows variations of control signal $V_{CONT1}$; and FIG. 4D shows variations of voltage $V_{S1}$ held in the sample-hold capacitor C2. Incidentally, waveforms of the terminal voltage $V_{N1}$, current $I_{N1}$, control signal $V_{CONT2}$, and voltage $V_{S2}$, which are measured with respect to the NMOS transistor N1, may be inverse to those of the aforementioned ones shown in FIGS. 4A to 4D; therefore, they will not be illustrated and described in detail.

Figure 5:
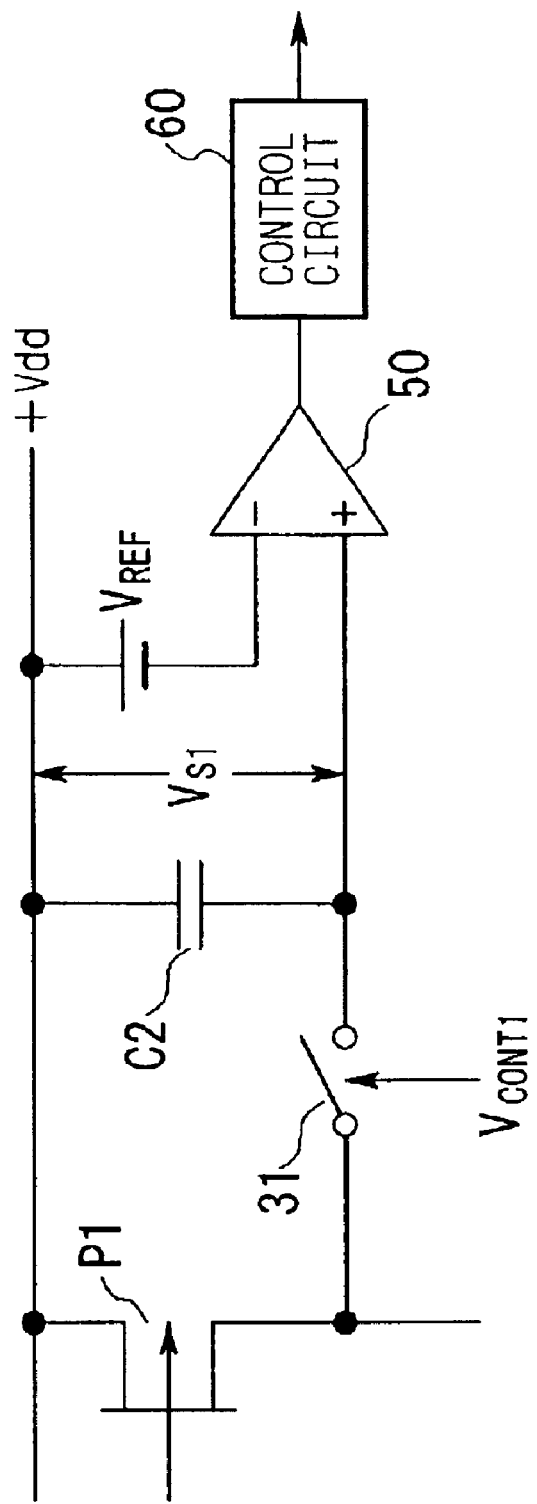
FIG. 5 shows the configuration of an overcurrent protection circuit arranged in connection with the PMOS transistor.
Figures 6A, 6B, 6C, 6D, 6E:
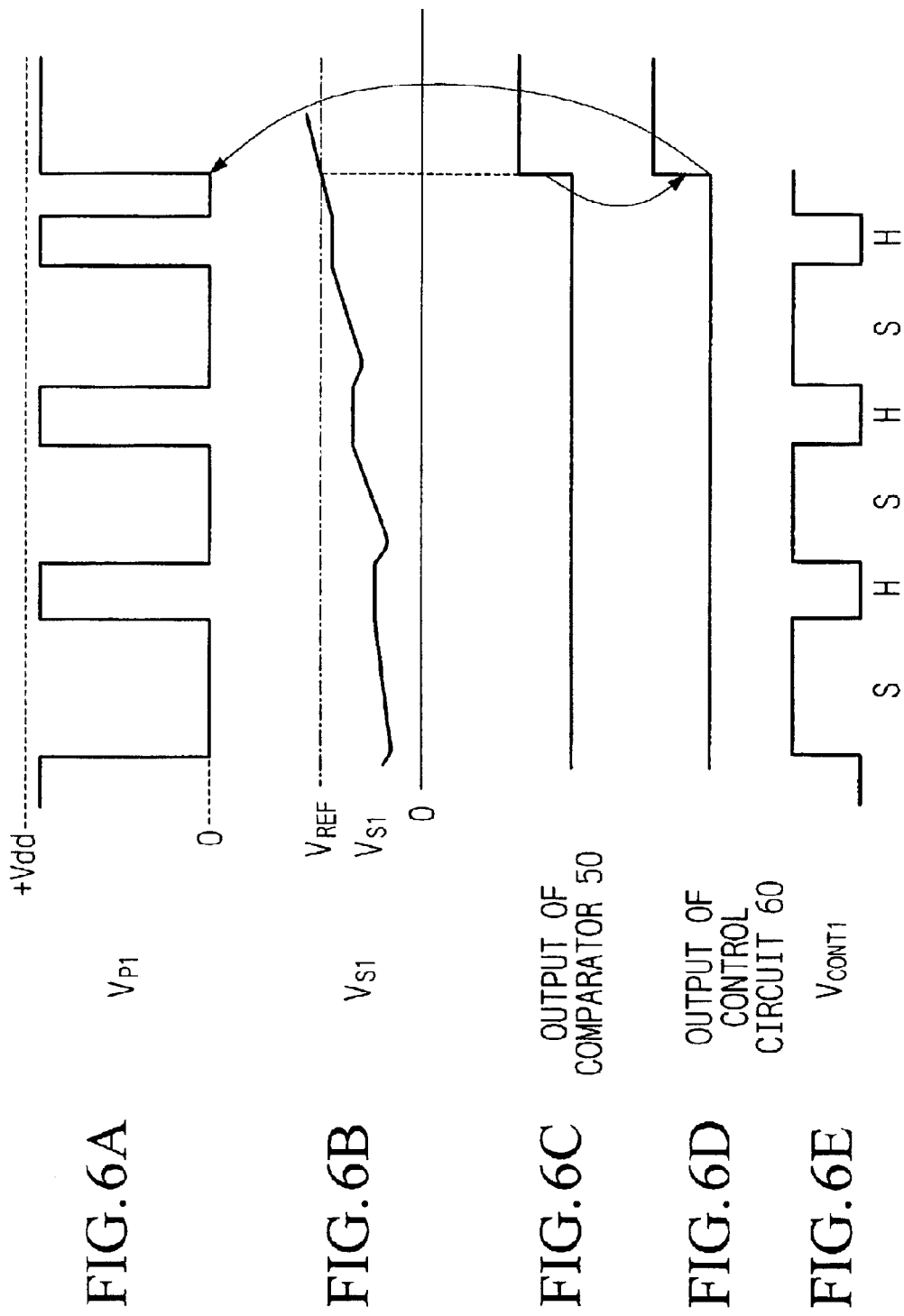
FIG. 6A shows a waveform representing variations of terminal voltage $V_{P1}$ of the PMOS transistor shown in FIG. 5.
FIG. 6B shows a waveform representing variations of detection voltage $V_{S1}$ detected by the capacitor arranged in connection with the PMOS transistor in FIG. 5.
FIG. 6C shows the output of the comparator shown in FIG. 5.
FIG. 6D shows the output of the control circuit shown in FIG. 5.
FIG. 6E shows a waveform representing variations of the control signal for periodically turning on and off the analog switch shown in FIG. 5.

Next, FIG. 5 shows the configuration of an overcurrent protection circuit that is designed using the aforementioned current detection circuit. Incidentally, FIG. 5 shows only a single overcurrent protection circuit in connection with the PMOS transistor P1.

That is, when the PMOS transistor P1 is turned on, the capacitor C2 holds the terminal voltage of the PMOS transistor P1 via the analog switch 31, thus providing detection voltage $V_{S1}$. A comparator 50 compares the detection voltage $V_{S1}$ with reference voltage $V_{REF}$ that is used for determination of the occurrence of an overcurrent flowing through the PMOS transistor P1. Specifically, the comparator 50 determines whether or not the detection voltage $V_{S1}$ exceeds a reference voltage $V_{REF}$. A control circuit 60 operates in response to the output of the comparator 50. That is, when the detection voltage $V_{S1}$ exceeds the reference voltage $V_{REF}$, the control circuit 60 compulsorily turns off the PMOS transistor P1.

In the above, the reference voltage $V_{REF}$ is set in advance based on the internal resistance (or on-resistance) of the PMOS transistor P1 that is turned on. For example, the reference voltage $V_{REF}$ is set to the prescribed voltage when the current flowing through the PMOS transistor P1 increases abnormally high close to the prescribed overcurrent. FIG. 5 shows only the configuration of the overcurrent detection circuit in connection with the PMOS transistor P1. Of course, it is possible to arrange a 'similar' overcurrent protection circuit in connection with the NMOS transistor N1.

When the detection voltage $V_{S1}$, which is held by the capacitor C2 at the ON-timing of the PMOS transistor P1, exceeds the reference voltage $V_{REF}$, the comparator 50 outputs a decision signal (i.e., a high-level signal) representing that the detection voltage $V_{S1}$ exceeds the reference voltage $V_{REF}$. The decision signal is supplied to the control circuit 60.

In response to the decision signal output from the comparator 50, the control circuit 60 outputs a control signal to the gate of the PMOS transistor P1 to compulsorily turn off. Similarly, another control circuit (not shown) outputs a control signal to the gate of the NMOS transistor N1 to compulsorily turn off. At this time, prescribed voltages are applied in prescribed polarities to these transistors P1 and N1, which will be compulsorily turned off in response to the above control signals respectively.

When the PMOS transistor P1 and the NMOS transistor N1 are both turned off, the PWM amplifier stops supplying load current to the load. Hence, it is possible to reliably ensure protection against overcurrent, which is prevented from flowing through the switching transistors (P1 and N1) of the PWM amplifier. Thus, it is possible to reliably prevent the load from being destroyed due to overcurrent.

The overall operation of the overcurrent protection circuit will be described with reference to FIGS. 6A to 6E.

That is, since the analog switch 31 is periodically turned on and off in response to the control signal $V_{CONT1}$ (see FIG. 6E), the capacitor C2 periodically charges and discharges the terminal voltage $V_{P1}$ of the PMOS transistor P1 (see FIG. 6A), thus producing the detection voltage $V_{S1}$ (see FIG. 6B), which is gradually increased towards the reference voltage $V_{REF}$. When the detection voltage $V_{S1}$ exceeds the reference voltage $V_{REF}$, the output of the comparator 50 becomes high (see FIG. 6C), so that the output of the control circuit 60 becomes high (see FIG. 6D), at which the PMOS transistor P1 is automatically turned off. Thus, the control circuit 60 compulsorily turns off the PMOS transistor P1 through which an overcurrent may flow.

Similarly, the control circuit 60 compulsorily turns off the NMOS transistor N1 through which an overcurrent may flow. By compulsorily turning off the PMOS transistor P1 and the NMOS transistor N1 at appropriate timings, it is possible to reliably ensure protection for the load, which is prevented from being destroyed or damaged due to overcurrent in the PWM amplifier.

Figure 7:
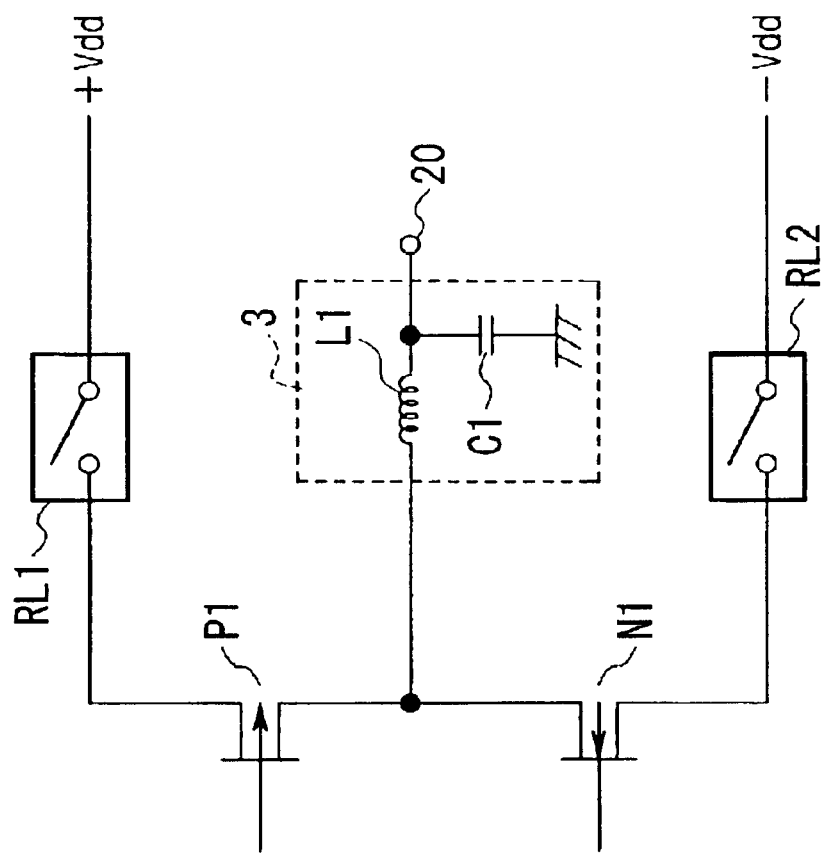
FIG. 7 is a circuit diagram showing a modified example of the overcurrent protection circuit using relay contacts arranged in connection with the PMOS transistor and NMOS transistor respectively.

The aforementioned overcurrent protection may not be necessarily realized by directly supplying control signals (or control voltages) to the gates of the switching transistors in the PWM amplifier. That is, it is possible to modify the circuitry as shown in FIG. 7, wherein a relay contact RL1 is arranged between the source of the PMOS transistor P1 and the positive source voltage+Vdd, and a relay contact RL2 is arranged between the source of the NMOS transistor N1 and the negative source voltage−Vdd. These relay contacts RL1 and RL2 are adequately opened to shut off the power supply to the transistors P1 and N1 in response to control signals output from the control circuit 60. Specifically, when an overcurrent flows through the PMOS transistor P1, the relay contact RL1 is opened to shut off the positive source voltage+Vdd supplied to the source of the PMOS transistor P1, which is compulsorily turned off. When an overcurrent flows through the NMOS transistor N1, the relay contact RL2 is opened to shut off the negative source voltage−Vdd supplied to the source of the NMOS transistor N1, which is compulsorily turned off.

As described heretofore, this invention has a variety of technical features and effects, which will be described below.

(1) The current detection method and circuit of this invention is characterized in that the current detection is performed with respect to switching transistors of the switching circuit such as the PWM amplifier without using the specific resistor, which may cause unwanted power loss. Specifically, the terminal voltage of the switching transistor that is turned on is detected as the detection voltage equivalent to the current flowing through the switching transistor based on its on-resistance, which is sensed or specified in advance. Thus, it is possible to obtain a high accuracy in the current detection, which does not cause unwanted power loss due to the provision of a resistor.

(2) The overcurrent protection circuit can be constituted using the aforementioned current detection circuit in order to reliably ensure protection against abnormally high overcurrent flowing through the switching transistor(s) of the PWM amplifier. Because the 'highly accurate' current detection can be performed with respect to the switching transistor(s), it is possible to reliably prevent the load (e.g., speaker) from being destroyed or damaged due to overcurrent flowing through the switching transistor(s) of the PWM amplifier.

As this invention may be embodied in several forms without departing from the spirit or essential characteristics thereof, the present embodiments are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. A current detection circuit applicable to a switching circuit that uses at least one switching transistor to supply a prescribed load current to a load, comprising:

a sample-hold capacitor for temporarily holding a voltage across a source terminal and a drain terminal of the switching transistor that is turned on;

an analog switch that is inserted between the switching transistor and the sample-hold capacitor;

a controller for controlling the analog switch to be turned on in synchronization with ON-timing of the switching transistor; and a detector for detecting a charged voltage of the sample-hold capacitor as detection voltage.

2. A current detection circuit according to claim 1, wherein the switching circuit is a pulse-width modulation (PWM) amplifier using a pair of a PMOS transistor and an NMOS transistor that are alternately turned on or off, so that the load current is extracted from a connection point between drains of the PMOS transistor and the NMOS transistor.

3. An overcurrent protection circuit applicable to a switching circuit that uses at least one switching transistor to supply a prescribed load current to a load, comprising:

a sample-hold capacitor for temporarily holding a voltage across a source terminal and a drain terminal of the switching transistor that is turned on;

an analog switch that is inserted between the switching transistor and the sample-hold capacitor and that is controlled to be turned on in synchronization with ON-timing of the switching transistor;

an overcurrent determination means for determining whether or not a detection voltage, corresponding to a charged voltage of the sample-hold capacitor, exceeds a reference voltage, which is set in advance; and a controller for compulsorily turning off the switching transistor based on the output of the overcurrent determination means when the detection voltage exceeds the reference voltage.

4. An overcurrent protection circuit according to claim 3, wherein the overcurrent determination means is a comparator that compares the detection voltage with the reference voltage.

5. An overcurrent protection circuit according to claim 3, wherein the switching circuit is a pulse-width modulation (PWM) amplifier using a pair of a PMOS transistor and an NMOS transistor that are alternately turned on or off, so that the load current is extracted from a connection point between drains of the PMOS transistor and the NMOS transistor.

6. A pulse width modulation amplifier, comprising:

a switching circuit that uses at least one switching transistor to supply a prescribed load current to a load; and an overcurrent protection circuit applicable to the switching circuit, the overcurrent protection circuit including:

a sample-hold capacitor, including a first terminal and a second terminal, for temporarily holding a voltage across a source terminal and a drain terminal of the switching transistor that is turned on;

an analog switch that is inserted between the drain terminal of the switching transistor and the second terminal of the sample-hold capacitor and that is controlled to be turned on in synchronization with ON-timing of the switching transistor;

an overcurrent determination means, for determining whether or not a detection voltage, corresponding to a charged voltage of the sample-hold capacitor, exceeds a reference voltage, which is set in advance, the overcurrent detection means coupled to a second terminal of the capacitor and a terminal of the reference voltage; and a controller for compulsorily turning off the switching transistor based on the output of the overcurrent determination means when the detection voltage exceeds the reference voltage, so as control the load current being supplied to the load.

7. A pulse width modulation amplifier according to claim 6, wherein the switching circuit uses a pair of a PMOS transistor and an NMOS transistor that are alternately turned on or off, so that the load current is extracted from a connection point between drains of the PMOS transistor and the NMOS transistor.

* * * * *